United States Patent
Grauer et al.

(10) Patent No.: US 9,538,113 B2
(45) Date of Patent: Jan. 3, 2017

(54) MULTIPLE GATED PIXEL PER READOUT

(71) Applicant: BRIGHTWAY VISION LTD., Haifa (IL)

(72) Inventors: Yoav Grauer, Haifa (IL); David Ofer, Haifa (IL); Ya'ara David, Kiryat Tiv'on (IL); Haim Garten, Haifa (IL); Alon Krelboim, Haifa (IL); Sharon Lifshits, Haifa (IL); Oren Sheich, Yoqneam (IL)

(73) Assignee: BRIGHTWAY VISION LTD., Haifa (IL)

( * ) Notice: Subject to any disclaimer, the term of this patent is extended or adjusted under 35 U.S.C. 154(b) by 0 days.

(21) Appl. No.: 14/924,878

(22) Filed: Oct. 28, 2015

(65) Prior Publication Data
US 2016/0050383 A1    Feb. 18, 2016

Related U.S. Application Data

(63) Continuation of application No. 14/700,191, filed on Apr. 30, 2015, now Pat. No. 9,219,873, which is a (Continued)

(51) Int. Cl.
*H04N 5/378* (2011.01)
*H04N 5/353* (2011.01)
(Continued)

(52) U.S. Cl.
CPC ........ *H04N 5/378* (2013.01); *H01L 27/14612* (2013.01); *H01L 27/14621* (2013.01);
(Continued)

(58) Field of Classification Search
CPC .............. H01L 27/14612; H01L 27/14621; H01L 27/14875; H01L 27/14887; H04N 5/33; H04N 5/353; H04N 5/35536; H04N 5/35572; H04N 5/3591; H04N 5/3592; H04N 5/3594; H04N 5/378
See application file for complete search history.

(56) References Cited

U.S. PATENT DOCUMENTS

| 7,733,464 B2 | 6/2010 | David et al. |
| 2010/0231771 A1 | 9/2010 | Yaghmai |

(Continued)

FOREIGN PATENT DOCUMENTS

| EP | 1 118 208 | 11/2004 |
| WO | WO 2007/024582 | 3/2007 |
| WO | WO 2010/084493 | 7/2010 |

OTHER PUBLICATIONS

International Search Report for International Application No. PCT/IL2013/050331 date of mailing Aug. 5, 2013.
(Continued)

*Primary Examiner* — Mark R Gaworecki
(74) *Attorney, Agent, or Firm* — Pearl Cohen Zedek Latzer Baratz LLP

(57) ABSTRACT

A system for providing an improved image of daytime and nighttime scene for a viewer within a vehicle is provided herein. The system includes: a pixel array sensor having a fully masked gate-off capability at a single pixel level, wherein the pixel array sensor is provided with an inherent anti-blooming capability at the single pixel level; wherein each pixel is gated by a corresponding transfer gate transistor having high transfer gate efficiency. The system further includes a gating unit configured to control the transfer gate transistors with pulsed or continuous wave modulated active and passive light sources, to yield a synchronized sensing signal from the sensor, wherein a single pulse is sufficient to cover the entire field of view of the sensor and the entire depth of field of the illuminated scene; and a processing unit configured to receive the synchronized sensing signal and process it.

21 Claims, 5 Drawing Sheets

Related U.S. Application Data continuation of application No. 14/394,576, filed as application No. PCT/IL2013/050331 on Apr. 17, 2013, now Pat. No. 9,088,744.

(60) Provisional application No. 61/625,756, filed on Apr. 18, 2012.

(51) Int. Cl.
- *H01L 27/148* (2006.01)
- *H01L 27/146* (2006.01)
- *H04N 5/359* (2011.01)
- *H04N 5/355* (2011.01)
- *H04N 5/33* (2006.01)

(52) U.S. Cl.
CPC .. *H01L 27/14875* (2013.01); *H01L 27/14887* (2013.01); *H04N 5/353* (2013.01); *H04N 5/3591* (2013.01); *H04N 5/3592* (2013.01); *H04N 5/3594* (2013.01); *H04N 5/35536* (2013.01); *H04N 5/35572* (2013.01); *H04N 5/33* (2013.01)

(56) References Cited

U.S. PATENT DOCUMENTS

| | | |
|---|---|---|
| 2011/0013065 A1 | 1/2011 | Shinohara |
| 2011/0080500 A1 | 4/2011 | Wang et al. |
| 2012/0033118 A1 | 2/2012 | Lee et al. |
| 2015/0009375 A1 | 1/2015 | Agranov et al. |
| 2015/0156387 A1 | 6/2015 | Miyakoshi |

OTHER PUBLICATIONS

Supplementary European Search Report of EP Application No. 13777927.8, mailed on Feb. 25, 2016.

Figure 2

| PIXEL OPERATIONAL STEPS (STATES) | RESET & RESET READ | | | | GATING (#X LIGHT SOURCE PULSES FOLLOWED BY #X TRANSFERS) | | | | | | | | | | | | | SIGNAL READ | |
|---|---|---|---|---|---|---|---|---|---|---|---|---|---|---|---|---|---|---|---|
| | A1 | A2 | A3 | A4 | A5 | A6 | A7 | A8 | A9 | A10 | A11 | A'2 | A13 | A'1 | A15 | A16 | A17 | A'8 |
| LIGHT SOURCE PULSE | | | | | | | | | | | | | | | | | | |
| PIXEL SELECT (SEL) | ▨ | | | | | | | | | | | | | | | | ▨ | |
| PIXEL RESET (RST) | | ▨ | | | | | | | | | | | | | | | | |
| PIXEL SAMPLE REST | | | ▨ | | | | | | | | | | | | | | | |
| PIXEL SAMPLE SIGNAL | | | | | | | | | | | | | | | | | ▨ | |
| TX2 CONTROL (TX2) | | | | | ▨ | | ▨ | | ▨ | | ▨ | | ▨ | | ▨ | | ▨ | |
| TX1 CONTROL (TX1) | | | | ▨ | | ▨ | | ▨ | | ▨ | | ▨ | | ▨ | | ▨ | | |

Figure 3

| PIXEL OPERATIONAL STEPS (STATES) | RESET & RESET READ | | | | GATING (#X TRANSFER) | | | | | | | | | | | | | SIGNAL READ | |
|---|---|---|---|---|---|---|---|---|---|---|---|---|---|---|---|---|---|---|---|
| | B1 | B2 | B3 | B4 | B5 | B6 | B7 | B8 | B9 | B10 | B11 | B12 | B13 | B14 | B15 | B16 | B17 | B18 |
| PIXEL SELECT (SEL) | ▨ | | | | | | | | | | | | | | | | ▨ | |
| PIXEL RESET (RST) | | ▨ | | | | | | | | | | | | | | | | |
| PIXEL SAMPLE REST | | | ▨ | | | | | | | | | | | | | | | |
| PIXEL SAMPLE SIGNAL | | | | | | | | | | | | | | | | | ▨ | |
| TX2 CONTROL (TX2) | | | | | ▨ | | ▨ | | ▨ | | ▨ | | ▨ | | ▨ | | ▨ | |
| TX1 CONTROL (TX1) | | | | ▨ | | ▨ | | ▨ | | ▨ | | ▨ | | ▨ | | ▨ | | |

$\Theta_{light\_X} := 24\,deg$          LIGHT DIVERGENCE (x-AXIS)

$\Theta_{light\_Y} := 8\,deg$          LIGHT DIVERGENCE (y-AXIS)

$\tau_{light} := 0.8$          OPTICAL TRANSMISSION (LENS)

$t_{gate} := 1\,\mu sec$          LIGHT/GATE PULSE FWHM $R := 1m, 2m .. 300m$          RANGE $N := 1, 2 .. 1000$          # OF PULSES/GATES (PER SINGLE READOUT)

SIMULATION $$\gamma := \frac{-\ln(0.02)}{Vis} \cdot \left(\frac{\lambda}{0.55\mu m}\right)^{-1.3}$$      ATTENUATION COEFFICIENT $$\gamma = 0.24\,km^{-1}$$

$$Sens := \frac{QE \cdot ELECTRON \cdot \lambda}{h \cdot c}$$      SPECTRAL SENSITIVITY $$Sens := 0.258\,\frac{amp}{watt}$$

SIGNAL PER SINGLE GATE AS FUNCTION OF RANGE [ELECRONS]

$$SIGNAL(R) := \frac{Sens \cdot \frac{P_{light} \cdot \tau_{light}}{\pi \cdot \left(\tan\left(\frac{\Theta_{light\_X}}{2}\right) \cdot \tan\left(\frac{\Theta_{light\_Y}}{2}\right) \cdot R^2\right)} \cdot \frac{T_{optic} \cdot r_{target} \cdot e^{-2\gamma R}}{4 \cdot F_{num}^2} \cdot t_{gate} d^2}{ELECTRON}$$

Figure 4 (CONT.)

NOISE PER SINGLE GATE AS
FUNCTION OF RANGE [ELECTRONS]

$$\text{NOISE}(R, n_{transfer}) := \sqrt{\text{SIGNAL}(R) + n_{transfer}}$$

SNR AS FUNCTION OF RANGE
AND PULSES/GATES $$\text{SNR}(R_{transfer}, N) := \sqrt{N} \cdot \frac{\text{SIGNAL}(R)}{\text{NOISE}(R + n_{transfer})}$$

Figure 4 (CONT.)

MULTIPLE GATED PIXEL PER READOUT

CROSS-REFERENCE TO RELATED APPLICATIONS

This application is a Continuation of U.S. patent application Ser. No. 14/700,191, filed Apr. 30, 2015, which is a Continuation of U.S. patent application Ser. No. 14/394,576, filed Oct. 15, 2014, which is a National Phase Application of PCT International Application No. PCT/IL2013/050331, International Filing Date Apr. 17, 2013, claiming priority of U.S. Provisional Patent Application No. 61/625,756, filed Apr. 18, 2012, all of which are hereby incorporated in their entirety.

BACKGROUND OF THE INVENTION

1. Technical Field of the Invention

The present invention relates to the field of imaging system, and, more particularly, to active and/or passive imaging by multiple gated low noise pixel per readout frame method.

2. Discussion of Related Art

U.S. Pat. No. 7,733,464 B2, titled "vehicle mounted night vision imaging system and method" teaches a device and method for improving visibility conditions in a motor vehicle during low-visibility environment (nighttime or nighttime with poor visibility conditions such as rain, snow etc.). The system described in the aforementioned patent is based on gated imaging technology (i.e. the imaging sensor utilizes reflected light signal). In addition, the aforementioned system implements a sensor that is based on image intensification technology using photocathode and/or microchannel plate. This type of image intensification technology has inherent drawbacks in vehicular environment; sensitivity lose due to high temperature (above 50 deg Celsius), sensitivity lose due to solar irradiance, burn effect due to a constant static image projection to the photocathode, temporal noise and blooming (saturation) in an inter-scene dynamic range above 50 dB. This type of image intensification technology is also defined as an export control item under the WASSENAAR arrangement or equivalent export control jurisdictions which cause difficulties in civilian application such as Advanced Driver Assistance Systems (ADAS). In addition, the system described in the aforementioned patent does not offer the driver any daytime imaging capabilities due to above drawbacks.

European Patent No. EP 1 118 208 B1, titled "measuring distances with a camera", teaches a device and method for measuring distances with a camera referred to as a "3D camera". Several gated pixel designs are described with a reset switch and at least a single gate switch or with a reset switch and at least a single modulator by a Field Effect Transistor (FET). These pixel designs have an integrator which is comprised of a storage capacitor and an amplifier. These gated pixel designs described in '208 B1 patent has low performance in low light level signal (such as in gated imaging vehicular applications) due to reset noise levels (also known as "KTC" noise) which are inherent in the integrator mechanism presented with the amplifier feedback in the pixel. In addition, noise levels and signal accumulation in the pixel integrator are not referred while gate off in the aforementioned patent. Anti-blooming ratio between pixel to the pixel apart is an important feature in an imaging sensor based on an array of gated pixels coupled and synchronized to a light source. In such a system configuration, a gated pixel can be bloomed (i.e. saturated even up to three magnitudes more than a nominal unsaturated signal) due to highly reflected objects (i.e. retro-reflector, mirror perpendicular to imaging sensor/light source etc.) in the viewed and/or measured scenery. Anti-blooming ratio between pixel to pixel apart are not described in the aforementioned patent.

SUMMARY OF THE INVENTION

One aspect of the present invention provides a system for providing an improved image of daytime and nighttime scene for a viewer. The system according to embodiments of the present invention may be operatively associated with any moving platform. In one non limiting example, the moving platform is a vehicle. It is understood however that any recitation of a vehicle herein may indicate use with any moving platform. In one embodiment, the system is located within a vehicle. The system may include: a pixel array sensor having a fully masked gate-off capability at a single pixel level, wherein the pixel array sensor is provided with an inherent anti-blooming capability at the single pixel level; wherein each pixel is gated by a corresponding transfer gate transistor having high transfer gate efficiency. The system further includes a gating unit configured to control the transfer gate transistors with pulsed or continuous modulated wave active light source (i.e. light source part of the gated system such as laser, LED, artificial light source etc.) and passive light sources (i.e. passive in the sense that the light sources are not part of the gated system such as LED's, artificial light sources etc. but are located in the gated system Field Of View [FOV]), to yield a synchronized sensing signal from the sensor, wherein a single pulse by the active light source is sufficient to cover the entire field of view of the sensor and the entire depth of field of the illuminated scene; and a processing unit configured to receive the synchronized sensing signal and process it, to yield an improved image of the scene. In some embodiments the pixel array sensor may be located within the vehicle and so reflections from the scene are attenuated by a windshield of the vehicle.

Another aspect of the present invention provides a method for enhancing imaging system mounted on a vehicle suitable for different light conditions. The method includes controlling the "ON" and "OFF" time of at least a single pixel synchronized to a gated source of illumination said source of illumination may be an active source (i.e. part of the system) or passive source (i.e. passive in the sense that the light source is not part of the gated system such as LED, artificial light source etc. but is located in the gated imaging system FOV). In the present technique when the pixel is in "ON" duration it will accumulate light pulse propagating from the desired object and will ignore pulses originating from clutter sources (such as background, highly reflective objects, specific modulation etc.) when turned to "OFF" duration. Once all the desired pulses of light are accumulated in the pixel Floating Diffusion (FD) or other method of pixel storage, the signal is readout to provide a single frame image. The disclosed technique provides many advantages over the known art few of them are:

A better Signal to Noise Ratio (SNR) image by accumulation of desired light signal (pulsed or modulated) and reducing background signal accumulation.

Immunity to high inter-scene dynamic range of the magnitude of 40 dB. For a multiple gated pixel array, the anti-blooming ratio is above 1,000 (60 dB), and desired around 10,000 (80 dB), between a saturated pixel to the third pixel apart.

Ability to synchronize to pulsed or modulated light in the multiple gated pixel Instantaneous Field Of View (IFOV) originating from a pulsed or modulated light source.

Ability to conduct a direct Time of Flight (TOF) imaging with a synchronized source of light reflected back to the multiple gated pixel IFOV.

Ability to gate at least a single pixel and/or to gate at least a single pixel array.

These, additional, and/or other aspects and/or advantages of the present invention are: set forth in the detailed description which follows; possibly inferable from the detailed description; and/or learnable by practice of the present invention.

BRIEF DESCRIPTION OF THE DRAWINGS

The present invention will be more readily understood from the detailed description of embodiments thereof made in conjunction with the accompanying drawings of which:

FIG. 2 and FIG. 3 are timing charts illustrating an aspect according to some embodiments of the present invention;

FIG. 4 shows formulation and units used in a simulation of an exemplary implementation in accordance with some embodiments of the present invention.

DETAILED DESCRIPTION OF THE INVENTION

Figure 1:
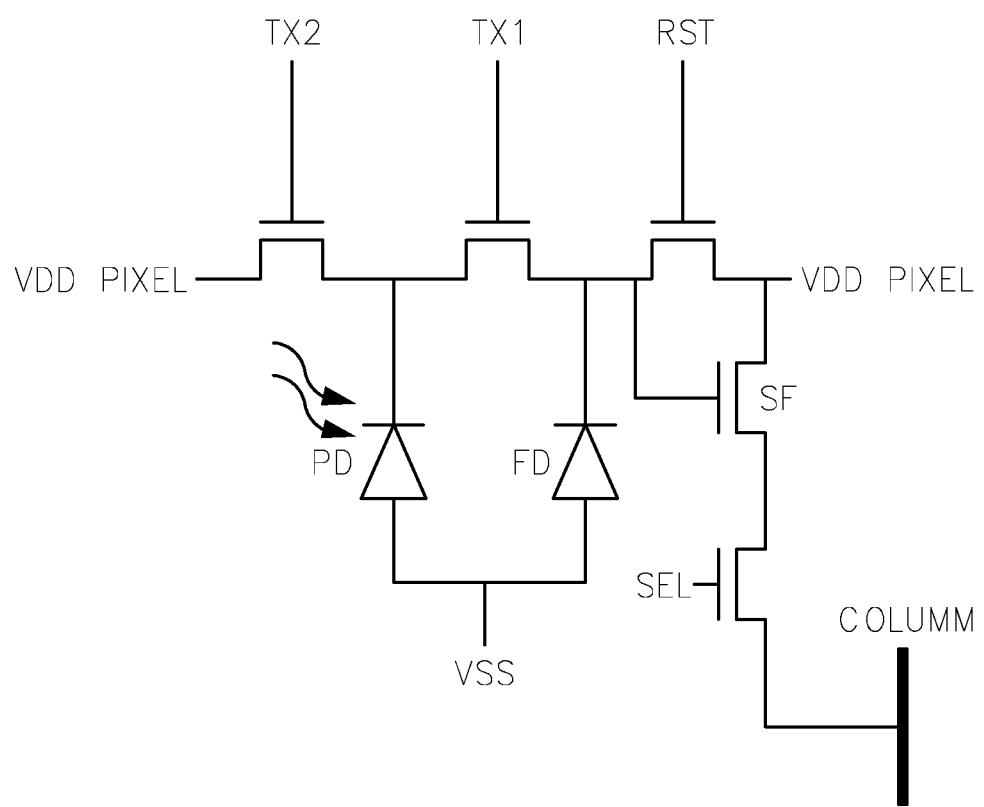
FIG. 1 is a schematic circuit diagram depicting a "gate-able" pixel according to some embodiment of the present invention.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting. FIG. 1 illustrates the "gate-able" pixel schematic that may be provided by Complementary Metal Oxide Semiconductor (CMOS) standard fabrication technology. Each pulse of light (i.e. each gate) is converted to a proportional electrical signal by the Photo-Diode (PD) that may be a pinned PD. The generated electrical signal from the PD is transferred by an electric field to the Floating Diffusion (FD) which acts as an integrator (i.e. capacitor) accumulating each converted pulse of light. Two controllable pixel signals generate the pixel gate; the transfer gate transistor (TX1) and the anti-blooming transistor (TX2). The anti-blooming transistor has three main objectives; the first being part of the single light pulse gating mechanism when coupled to TX1 (i.e. TX2 is turned from ON to OFF or TX2 is turned from OFF to ON), the second preventing undesired parasitic signal generated in the PD not to be accumulated in the PD during the time TX1 is OFF (i.e. PD Reset) and the third to channel excessive electrical signal originated in the PD when TX1 is ON, hence the role of anti-blooming. Anti-blooming TX2 controllable signal acts as an optical shutter which ends the single accumulated light pulse. Transfer gate transistor (TX1) is turned ON only in a desired time and only for a desired duration which is coupled to TX2. Once all pulses of light were accumulated in the FD, the signal is readout to provide a single frame image.

Multiple gated low noise pixel may have a standard electric signal chain after the "gate-able" PD, TX1, TX2 and PD configuration. This standard electric signal chain may consist of a Reset transistor (RST) with the role of charging the FD with electrical charge using the pixel voltage (VDD), may consist of a Source Follower (SF) transistor converting the accumulated signal (i.e. electrons) to voltage and may consist of a Select (SEL) transistor connected to the column and/or row for a pixel array.

This schematic circuit diagram depicting a "gate-able" pixel has a minimal of five transistors ("5T"). This pixel configuration may operate in a "gate-able" timing sequence as described hereinafter by FIG. 2 and FIG. 3. In addition this pixel may also operate in a standard 5T pixel timing sequence or operate in a standard 4T pixel timing sequence. This versatile operating configuration (i.e. gating sequence or standard 5T or standard 4T) enables to operate the pixel different lighting conditions. For example, gating timing sequence during low light level in active gated mode (with gated illumination), 4T timing sequence during low light level during nighttime (without illumination) and 5T timing sequence during high light level during daytime. This schematic circuit diagram depicting a "gate-able" pixel may also have additional circuits for internal Correlated Double Sampling (CDS) and/or for High Dynamic Range (HDR). Adding such additional circuits reduces the photo-sensing fill factor (i.e. sensitivity of the pixel).

FIG. 2 illustrates a flow chart of the multiple gated low noise pixel array timing sequence for an active gated imaging where each light source (such as originating from a laser and/or LED and/or arc light or any other triggered light source of the active gated imaging system) reflected pulse is synchronized to each pixel gate event. The timing sequence is illustrated (not to scale) by steps, where each step indicates a period of time and a signal ON is indicated in a black cell. All the steps will be clearer in a flow chart:

Step A1: A pixel Select transistor (SEL) is ON providing the specific row array selection from of all the array rows and pixel anti-blooming (TX2) is ON (i.e. VSS voltage level which is lower than VDD) providing undesired parasitic signal generated in the PD not to be accumulated in the PD.

Step A2: Pixel Reset transistor (RST) is ON providing the pixel FD to be fully deployed with charge and pixel anti-blooming (TX2) is ON providing undesired parasitic signal generated in the PD not to be accumulated in the PD.

Step A3: Pixel reset signal is sampled providing the pixel FD signal level prior accumulation of at least a single desired exposure (i.e. gate). The pixel reset signal may be subtracted from the pixel signal sample in step A18 to eliminate the offset signal (hence CDS which is done externally to the pixel in a gated configuration as illustrated in FIG. 1). Anti-blooming (TX2) is ON providing undesired parasitic signal generated in the PD not to be accumulated in the PD.

Step A4: Pulse of light (part of the active gated imaging) source is generated and anti-blooming (TX2) is ON providing undesired parasitic signal generated in the PD not to be accumulated in the PD.

Step A5: Pulse of light source (part of the active gated imaging) propagates to a desired distance and reflected back to the pixel and anti-blooming (TX2) is turned OFF providing the beginning of signal generated in the PD to be transferred via transfer gate (TX1).

Step A6: Pixel transfer transistor (TX1) is turned ON to transfer the electrical signal generated in the PD to the FD followed by anti-blooming (TX2) turned back ON ending the single gate transfer event and providing undesired parasitic signal generated in the PD not to be accumulated in the PD. TX1 ON period is equal or shorter than the light pulse time to accumulate the desired pulse reflected signal and to reduce background signal accumulation.

Step A7: Pixel transfer transistor (TX1) is OFF with and anti-blooming (TX2) is ON providing undesired parasitic signal generated in the PD not to be accumulated in the PD.

Step A8: Similar to Step A4 but may have different timing as to Step A4. For example, Step 4 duration was 1 μsec (Full Width Half Maximum) while Step A8 duration is 0.5 μsec or Step A4 duration was 1 μsec while Step A8 duration is 1.5 μsec etc.

Step A9: Similar to Step A5 but may have different timing as to Step A5 providing a different accumulation starting distance in the pixel FOV. For example, Step A5 duration was 1 μsec (i.e. equal to a starting distance of about 150 m for light propagation in free space) while Step A9 duration is 0.5 μsec (i.e. equal to a starting distance of about 75 m for light propagation in free space).

Step A10: Similar to Step A6 but may have different timing as to Step A6 to accumulate a light source pulse duration in Step A8 (equal or shorter than the light pulse time). The time provides a different accumulation depth of field distance in the pixel FOV. For example, Step A6 duration was 1 μsec (i.e. equal to a depth of field of about 150 m for light propagation in free space) while step A10 is 0.6 μsec (i.e. equal to a depth of field of about 90 m for light propagation in free space).

Step A11: Similar to Step A7 but may have different timing as to Step A7.

Step A12-Step A15: Similar to Step A4-Step A7 and to Step A8-Step A11 but may have different timings as indicated above. The pixel gate (light exposure and accumulation) may be conducted once, twice or #X gates (events) per pixel readout.

Step A16: After at least a single gate transfer event, anti-blooming (TX2) may be ON providing undesired parasitic signal generated in the PD not to be accumulated in the PD.

Step A17-Step A18: Standard pixel readout is provided. While anti-blooming (TX2) is ON providing undesired parasitic signal generated in the PD not to be accumulated in the PD and in the FD, pixel select transistor (SEL) is ON and the accumulated pixel signal is readout from the FD via the Source Follower (SF) transistor.

In active gated imaging with an array of multiple gated low noise pixels per readout, the timing sequence of gate transistor (TX1) and the anti-blooming transistor (TX2) of Step A5 duration and Step A6 duration for at least a single light pulse (i.e. single gate) may vary from pixel to pixel or from pixel array cluster to pixel array cluster. This enables each pixel or pixel array cluster to accumulate a different depth of field distance and/or starting distance in the pixel FOV.

According to some embodiment, gating unit is further configured to simultaneously gate at least two pixel clusters with different gating parameters by independently controlling the transfer gate transistors of the pixels at the at least two pixel clusters. In addition, the different gating parameters may include synchronization parameters in regard with one or more light source, to match a different scenery volume for the different pixel clusters. The scenery volume is defined as a volume portion in the scene that is defined by borders such as different depth of field distance and/or starting distance in the pixel FOV.

FIG. 3 illustrates a flow chart of the multiple gated low noise pixel array timing sequence for a passive gated imaging where pixel gate timing may be synchronized or unsynchronized to an external light source (originating from a laser and/or LED and/or arc light or any other triggered light source not part of the gated imaging system but is located in the gated imaging system FOV) for example a traffic sign flickering light source. In contrast with active gated imaging timing described above, passive gated imaging timing of each gate (i.e. pixel exposure to light which is a function of TX1 and TX2) may not be synchronized to the pulse light source. The multiple gates (i.e. exposures) with different timings provides the adequate light source signal level as to the background signal in a single pixel readout. The timing sequence is illustrated (not to scale) by steps, where each step indicates a period of time and a signal ON is indicated in a black cell. All the steps will be clearer in a flow chart:

Step B1: A pixel Select transistor (SEL) is ON providing the specific row array selection from of all the array rows and pixel anti-blooming (TX2) is ON (i.e. VSS voltage level which is lower than VDD) providing undesired parasitic signal generated in the PD not to be accumulated in the PD.

Step B2: Pixel Reset transistor (RST) is ON providing the pixel FD to be fully deployed with charge and pixel anti-blooming (TX2) is ON providing undesired parasitic signal generated in the PD not to be accumulated in the PD.

Step B3: Pixel reset signal is sampled providing the pixel FD signal level prior accumulation of at least a single desired exposure (i.e. gate). The pixel reset signal may be subtracted from the pixel signal sample in step B18 to eliminate the offset signal (hence CDS which is done externally to the pixel in a gated configuration as illustrated in FIG. 1). Anti-blooming (TX2) is ON providing undesired parasitic signal generated in the PD not to be accumulated in the PD.

Step B4: Pulse of light source (not part of the gated imaging but is located in the gated imaging system FOV) is generated and anti-blooming (TX2) is ON providing undesired parasitic signal generated in the PD not to be accumulated in the PD.

Step B5: Pulse of light source (not part of the gated imaging but is located in the gated imaging system FOV) propagates and transmitted to the pixel and anti-blooming (TX2) is turned OFF providing the beginning of signal generated in the PD to be transferred via transfer gate (TX1).

Step B6: Pixel transfer transistor (TX1) is turned ON to transfer the electrical signal generated in the PD to the FD followed by anti-blooming (TX2) turned back ON ending the single gate transfer event and providing undesired parasitic signal generated in the PD not to be accumulated in the PD. TX1 ON period should be equal or shorter than the light pulse time to accumulate the desired pulse transmitted signal and to reduce background signal accumulation.

Step B7: Pixel transfer transistor (TX1) is OFF with and anti-blooming (TX2) is ON providing undesired parasitic signal generated in the PD not to be accumulated in the PD.

Step B8: Similar to Step B4 but may have different timing as to Step B4. For example, Step B4 duration was 1 μsec (Full Width Half Maximum) while Step B8 duration is 0.5 μsec or Step B4 duration was 1 μsec while Step B8 duration is 1.5 μsec etc.

Step B9: Similar to Step B5 but may have different timing as to Step B5 providing different accumulation timing in the pixel FOV. For example, Step 5 duration was 1 μsec while Step B9 duration is 0.5 μsec.

Step B10: Similar to Step B6 but may have different timing as to Step B6 to accumulate a light source pulse duration in Step B8 (equal or shorter than the light pulse time). The time provides accumulation of light source pulse different duration time in the pixel FOV. For example, Step B6 duration was 1 μsec while step B10 is 0.6 μsec.

Step B11: Similar to Step B7 but may have different timing as to Step 7.

Step B12-Step B15: Similar to Step B4-Step B7 and to Step B8-Step B11 but may have different timings as indicated above. The pixel gate (light exposure and accumulation) may be conducted once, twice or #X gates (events) per pixel readout.

Step B16: After at least a single gate transfer event, anti-blooming (TX2) may be ON providing undesired parasitic signal generated in the PD not to be accumulated in the PD.

Step B17-Step B18: Standard pixel readout is provided. While anti-blooming (TX2) is ON providing undesired parasitic signal generated in the PD not to be accumulated in the PD, pixel select transistor (SEL) is ON and the accumulated pixel signal is readout from the FD via the Source Follower (SF) transistor.

FIG. 3 illustrates also a flow chart of the multiple gated low noise pixel array timing sequence for a passive gated imaging where pixel gate timing may accumulate signal of an external light source (originating from a laser and/or LED and/or arc light or any other continuous light source which are not part of the gated imaging system but is located in the gated imaging system FOV) for example sun irradiance. The at least single gate (i.e. exposure) may provide the adequate signal level in a single pixel readout. The timing sequence is illustrated (not to scale) by steps, where each step indicates a period of time and a signal ON is indicated in a black cell.

One of the key characteristic in the multiple gated low noise pixel is the opaqueness during gate OFF. Generated parasitic electrical signal in the FD while the pixel gate is OFF (i.e. TX1 at OFF and TX2 at ON) may be reduced by masking the FD (for example, by metal layers in the pixel structure) and/or by using the pixel micro-lens to channel the light away from the FD. Opaqueness during gate OFF levels are required to be as low as possible where response to the signal collected in a FD divided by the intensity of light at the integration time (gating/non-gating and readout time) shall be up to 0.01%. This value is required to cope with the backscatter intensity reflection in active imaging explained below. The governing parameter of an active imaging performance is the modulation contrast which we is defines as "Contrast" in Eq. (1), taking into account the air light, which is in this context light from ambient light sources that are scattered into the system's FOV and backscatter, which add to the target and background.

$$\text{Contrast} = \frac{I_{Target}^{Total} - I_{Background}^{Total}}{I_{Target}^{Total} + I_{Background}^{Total}} \quad (1)$$

$$= \frac{I_{Target} - I_{Background}}{I_{Target} + I_{Background} + 2I_{Air} + 2I_{Backscatter}},$$

where $$I_{Target}^{Total} = I_{Target} + I_{Air} + I_{Backscatter}$$

$$I_{Background}^{Total} = I_{Background} + I_{Air} + I_{Backscatter}. \quad (2)$$

$I_{Air}$ is the air-light contribution to the focal plane illumination. For night vision, there is very little or no air light and $I_{Air} \approx 0$. This result may be achieved using a narrow band pass filter (i.e. spectral filter). For harsh weather imaging conditions (e.g. dust or fog), we must take the air-light into account. The following presents a convenient method for predicting the effects of atmospheric backscatter on image quality when an artificial source near the image sensor is used to illuminate a distant scene. It is assumed that the separation between illuminator and imaging system is small compared to the range to the nearest illuminated particles in the FOV. Then, the radiance of the atmosphere within the FOV is calculated by summing the backscatter contributions of all illuminated particles on the path between the sensor and the scene. The result is $$I_{Backscatter} = \int_{2\gamma R_{min}}^{2\gamma R_{max}} \frac{PG\gamma^2 e^{-X}}{2F_{\#I}^2 \theta_I^2 X^2} dX, \quad (3)$$

where $$I_{Backscatter} = \text{Radiance of atmospheric backscatter} \left[ \frac{\text{Power}}{\text{Area}} \right]$$

$R_{min}$=Range from imaging system (and from illuminator) to the nearest illuminated particles in the FOV [Length]
$R_{max}$=Range from imaging system (and from illuminator) to the scene being imaged [Length]
P=Radiant intensity of illuminator [Power]
G=Backscatter gain of atmospheric particles relative to isotropic scattering [dimensionless]
$\gamma$=Atmospheric attenuation coefficient or "extinction coefficient" [Length$^{-1}$]
$F_{\#I}$=F number of the illuminator optics [dimensionless]
$\theta_I$=Illuminator beam divergence [Angular]
X=Integration variable.

With a narrow wavelength illuminator and the line-of-sight path through the atmosphere is taken to be horizontal, the atmospheric attenuation coefficient is considered constant.

Figure 5:
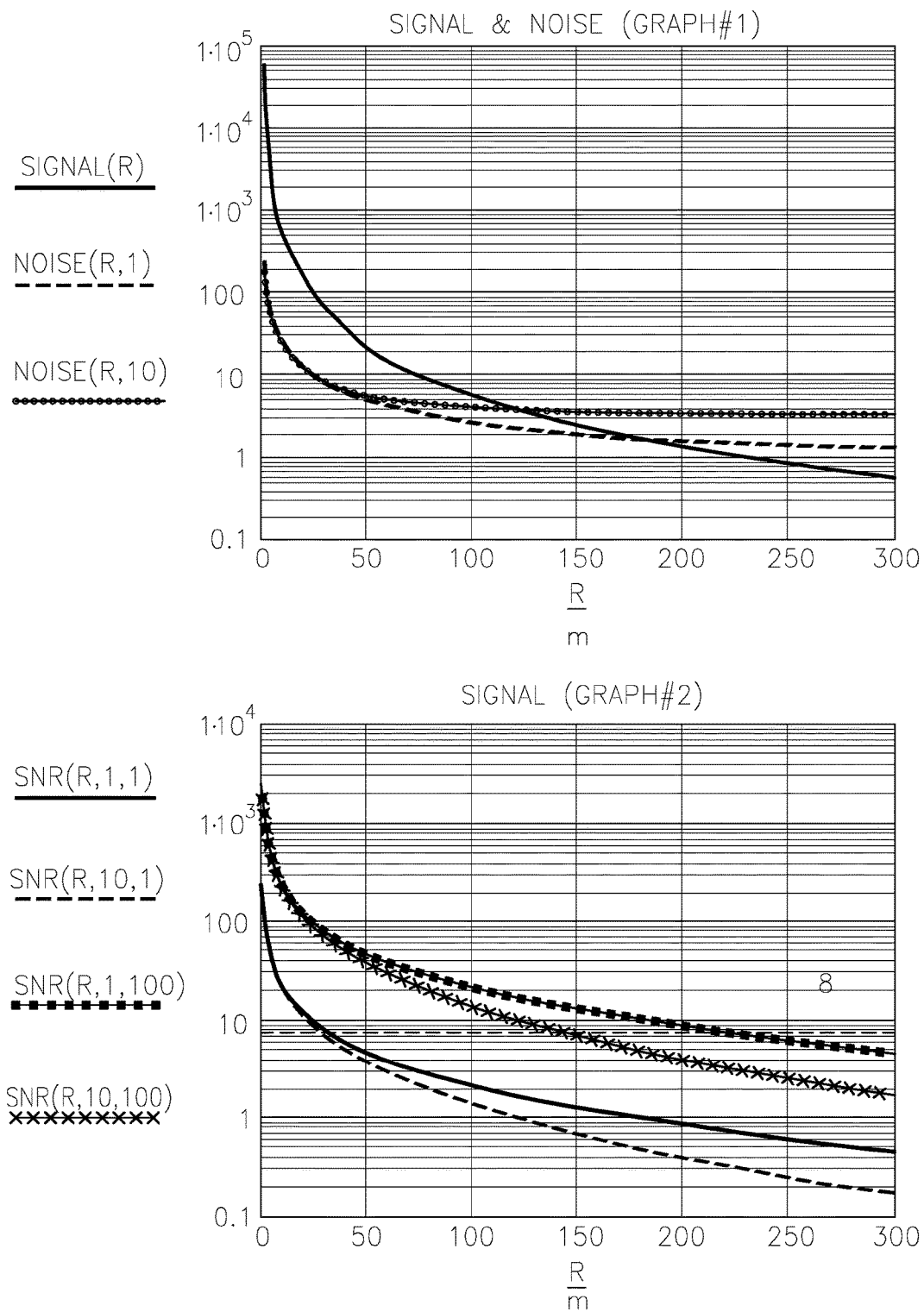
FIG. 5 shows graphs of a simulation of the exemplary implementation according to some embodiments of the present invention.

FIG. 4 and FIG. 5 illustrate another key characteristic in the multiple gated low noise pixel is the transfer gate transistor (TX1) noise (i.e. transfer efficiency). FIG. 4 provides the formulations and units used in the simulation while FIG. 5 shows the results of the simulation. In active gated imaging eye and skin safety standards may limit the light source (e.g. laser, LED etc.) optical peak power, optical average power etc. Gate transistor (TX1) noise (i.e. transfer efficiency) may be a crucial parameter in such a case. Gate transistor (TX1) noise (i.e. transfer efficiency) is a result of physical procedures of the electrical charge transfer uncertainty level. At least three different methods may be implemented in the pixel to provide a higher gate transfer (TX1) efficiency:

- Setting a high potential voltage between the PD to the FD enabling an intense electrical field which electrical charge carriers (i.e. at least a single electron) have higher probability to be "pulled" to the FD.
- Physical dimensions of the transfer gate, mainly on the TX1 PD side. As larger the transfer gate (TX1) the gate transfer efficiency to the FD is larger and vice versa.
- Physical structure of the transfer gate, mainly on the TX1 PD side. As "flawless" (i.e. without "holes") the transfer gate (TX1) the gate transfer efficiency to the FD is larger and vice versa.

The following example shall illustrate the influence of pixel signal, pixel noise level (only due to gate transfer) and pixel SNR. An example of a calculation of signal and noise levels (FIG. 5, graph #1):

A single light pulse accumulated signal (i.e. single gate transfer) in the FD as a function of target distance.

Noise level of a single light pulse accumulated signal (i.e. single gate transfer) in the FD as a function of target distance and noise transfer equivalent to one electron.

Noise level (only due to gate transfer) of a single light pulse accumulated signal (i.e. single gate transfer) in the FD as a function of target distance and noise transfer equivalent to ten electrons.

An example of a calculation of pixel SNR (FIG. 5, graph #2):

SNR as a function of a single light pulse accumulated signal (i.e. single gate transfer), noise transfer equivalent to a single electron and target distance.

Etc. with one hundred light pulses (i.e. one hundred gate transfers).

SNR as a function of a single light pulse accumulated signal (i.e. single gate transfer), noise transfer equivalent to ten electrons and target distance.

Etc. with one hundred light pulses (i.e. one hundred gate transfers).

In active gated imaging the raise time and fall time of transfer gate transistor (TX1), anti-blooming transistor (TX2) and source of light pulse are related directly to the depth of field distance and starting distance resolution/accuracy.

In passive gated imaging the raise time and fall time of transfer gate transistor (TX1), anti-blooming transistor (TX2) and source of light pulse (not part of the gated imaging system but is located in the gated imaging system FOV) are related directly to the signal accumulation of the pulse modulation.

The multiple gated pixel may have a thick Epitaxial layer above 12 μm and/or high resistivity layer as starting material for pixel wafer providing a higher PD spectral response (i.e. directly related to pixel fill factor and quantum efficiency) in the Near Infra-Red to values above 50%. As the Epitaxial layer is thicker the spectral response is larger but the Modulation Transfer Function (MTF) of the pixel is lower. For active gated imaging used mainly for night vision application the MTF reduction due to the thick Epitaxial layer and/or high resistivity layer is second order to the spectral response due to large pixel dimensions, preferably larger than 5 μm by 5 μm. The large pixel is required to accumulate more reflected light signal (i.e. larger pixel area) whereas the resolution during low light level (e.g. less than 0.1 lux) is not required.

Preferably, the multiple gated pixel and the multiple gated sensor (i.e. array of pixels with a readout interface) is produced using CMOS technology which complies with vehicular environment; high temperature storage and operation (above 50 deg Celsius), sensitivity is not damaged due to solar irradiance, no burn effect due to a constant static image projection to the gated pixel.

Preferably, a spectral filter is introduced in front of the multiple gated pixel and/or the multiple gated sensor (i.e. array of pixels with a readout interface) in active imaging (i.e. coupled to a light source) or passive imaging (i.e. passive in the sense that the light source is not part of the gated system such as LED, artificial light source etc. but is located in the gated imaging system FOV) to reduce ambient light accumulation at daytime, nighttime and other ambient light conditions. The spectral filter can be implemented in the pixel array level as a mosaic filter array (e.g. arranging spectral filters on a square grid of photo-sensors). The filter pattern can be; is 25% green, 25% red, 25% blue and 25% Near Infra-Red (NIR), hence is also called RGBN. The filter pattern can also be; is 50% clear (e.g. open to a wide spectral wavelengths), 25% red and 25% NIR, hence is also called CCRN. The filter pattern can also be; is 25% clear, 25% NIR in one specific wavelength and 25% NIR in a different specific wavelength, hence is also called CRN(1)N(2) (e.g. C: 450-850 nm, R: ~650 nm, N(1): 780-800 nm and N(2): 810-850 nm). The filter pattern can also be any other combination of green, red, blue, clear and NIR.

Preferably, a polarization filter is introduced in front of the multiple gated pixel and/or the multiple gated sensor (i.e. array of pixels with a readout interface) in active (i.e. coupled to a polarized light source) or passive imaging (i.e. passive in the sense that the light source is not part of the gated system such as LED, artificial light source etc. but is located in the gated imaging system FOV) to reduce ambient light accumulation at daytime, nighttime and other ambient light conditions.

Ability to conduct a direct TOF imaging with a synchronized source of light reflected back to the multiple gated pixel FOV may also be achieved be several methods such as performing Steps A1-A7 and rather than performing Step A8 perform several times a sequence of Steps A6-A7 with a short delay of $\Delta T$ between each sequence. Each delay of $\Delta T$ accumulates a different portion of the depth-of-field of $\Delta Z = \Delta T \cdot C/2$, where C is the speed of light. For example a delay of $\Delta T=100$ nsec between sequences of Step A6-A7 shall provide a depth-of-field of 15 m for each sequence.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

The invention claimed is:

1. A pixel sensor comprising:
    a photo sensor configured to convert light into proportional electrical signals;
    a charge pixel storage configured to accumulate a plurality of electrical signals converted by the photosensor from corresponding light;
    a first transistor coupled between a pixel voltage terminal and the photosensor, and configured to control a resetting of the photo sensor;
    a second transistor coupled between the photo sensor and the charge pixel storage, and configured to control a transfer of the accumulated electrical signal to the charge pixel storage;
    a reset transistor coupled between the charge pixel storage and the pixel voltage terminal and configured to reset the charge pixel storage at beginnings of electrical signal accumulation periods; and
    a pixel readout coupled between the charge pixel storage and an output,
    wherein the pixel sensor is configured to carry out the conversion of the transferred accumulated signal and the delivery thereof after a plurality of accumulated electrical signal transfers to the charge pixel storage.

2. The pixel sensor of claim 1, wherein the pixel sensor is configured, via the first transistor, to reset the photosensor at beginnings and at ends of electrical signal accumulation periods.

3. The pixel sensor of claim 1, wherein the pixel sensor is configured, via the second transistor, to transfer only a part of the accumulated signal to the charge pixel storage.

4. The pixel sensor of claim 1, wherein the photosensor is a pinned Photo-Diode (PD).

5. The pixel sensor of claim 1, wherein the charge pixel storage is a Floating Diffusion (FD).

6. The pixel sensor of claim 1, wherein the first transistor is further configured to prevent blooming of the photo sensor.

7. The pixel sensor of claim 1, wherein the pixel readout is coupled between the charge pixel storage and the output via a source follower transistor and a select transistor, wherein the source follower transistor is configured to convert the transferred accumulated signal from the charge pixel storage into voltage, and the select transistor is connected to a column and/or a row of a pixel array comprising the pixel sensor and configured to deliver the converted voltage thereto.

8. The pixel sensor of claim 1, further comprising at least one of: an additional circuit for internal correlated double sampling (CDS), and an additional circuit for high dynamic range (HDR).

9. A pixel array sensor comprising a plurality of the pixel sensors of claim 1.

10. The pixel array sensor of claim 9, wherein the duration of the electrical signal accumulation in the charge pixel storage is configured to be controlled with respect to a flickering lighting source.

11. The pixel array sensor of claim 10, further configured to accumulate information from the flickering lighting source into a single image frame of the flickering lighting source.

12. The pixel array sensor of claim 10, wherein the flickering lighting source comprises flickering light emitting diodes (LEDs) associated with at least one of: a traffic sign, a traffic light and a vehicle light.

13. An active gated imaging system comprising the pixel array sensor of claim 9, and pulsed illumination, wherein the duration of the electrical signal accumulation in the charge pixel storage is controlled with respect to the pulsed illumination.

14. The active gated imaging system of claim 13, wherein the pulsed illumination comprises at least one of: triggered laser, light emitting diode (LED) and arc light.

15. The active gated imaging system of claim 13, further configured to simultaneously gate at least two clusters of the pixel sensors with different gating parameters by independently controlling the corresponding transistors of the pixel sensors at the at least two pixel clusters.

16. The active gated imaging system of claim 15, wherein the different gating parameters comprise synchronization parameters with regard to one or more light source of the pulsed illumination, to match different volume portions in an illuminated scene to the different pixel clusters.

17. An imaging system comprising the pixel array sensor of claim 9, and a spectral filter implemented in the pixel array.

18. A method comprising:
   configuring a charge pixel storage to accumulate a plurality of electrical signals converted by a photosensor from corresponding light;
   coupling a first transistor between a pixel voltage terminal and the photosensor, and configuring the first transistor to control a resetting of the photo sensor;
   coupling a second transistor between the photo sensor and the charge pixel storage, and configuring the second transistor to control a transfer of the accumulated electrical signal to the charge pixel storage;
   coupling a reset transistor between the charge pixel storage and the pixel voltage terminal and configuring the reset transistor to reset the charge pixel storage at beginnings of electrical signal accumulation periods; and
   coupling a pixel readout between the charge pixel storage and an output, via a source follower transistor and a select transistor, configuring the source follower transistor to convert the transferred accumulated electrical signal from the charge pixel storage into voltage, and configuring the select transistor, connected to a column and/or a row of a pixel array comprising the pixel sensor, to deliver the converted voltage thereto,
   wherein the conversion of the transferred accumulated electrical signal and the delivery thereof are carried out after a plurality of accumulated electrical signal transfers to the charge pixel storage.

19. The method of claim 18, further comprising configuring a duration of the electrical signal accumulation in the charge pixel storage to be controlled with respect to a flickering light source or with respect to a pulsed illumination source.

20. The method of claim 19, wherein the duration is controlled with respect to the pulsed illumination source and further comprising simultaneously gating at least two clusters of the pixel sensors with different gating parameters by independently controlling the corresponding second transistors of the pixel sensors at the at least two pixel clusters.

21. A pixel sensor comprising:
   a photodiode (PD) configured to convert light pulses into proportional electrical signals,
   a floating diffusion (FD) configured to accumulate a plurality of electrical signals converted by the photodiode from corresponding light pulses, and
   at least two transistors configured to determine a duration of the accumulation of the electrical signals in the FD, wherein a first one of the at least two transistors is configured to control electrical signal transfer from the PD to the FD and a second one of the at least two transistors is configured to control the converted electrical signals in the PD,
   a reset transistor configured to charge the FD with electrical charge,
   a source follower transistor configured to convert the accumulated electrical signals into voltage, and
   a select transistor connected to a column and/or a row of a pixel array comprising the pixel sensor and configured to deliver the converted voltage thereto,
   wherein the pixel sensor is configured to provide a readout comprising at least a part of the accumulated electrical signals in the determined duration.

\* \* \* \* \*